(12) United States Patent
Kitazawa et al.

(10) Patent No.: US 10,677,720 B2
(45) Date of Patent: Jun. 9, 2020

(54) DETECTOR, CORRECTION METHOD AND CALIBRATION METHOD OF DETECTOR, DETECTION APPARATUS AND DETECTION SYSTEM

(71) Applicant: SHARP KABUSHIKI KAISHA, Sakai, Osaka (JP)

(72) Inventors: Tazuko Kitazawa, Sakai (JP); Go Mori, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 13 days.

(21) Appl. No.: 16/199,206

(22) Filed: Nov. 25, 2018

(65) Prior Publication Data

US 2019/0162656 A1     May 30, 2019

(30) Foreign Application Priority Data

Nov. 27, 2017    (JP) ................................ 2017-226926

(51) Int. Cl.
*G01J 3/02*        (2006.01)
*G01N 21/3504*    (2014.01)
(Continued)

(52) U.S. Cl.
CPC ........ *G01N 21/3504* (2013.01); *G01J 3/0297* (2013.01); *G01J 3/108* (2013.01);
(Continued)

(58) Field of Classification Search
CPC .......... G01J 2003/006; G01J 2003/104; G01J 2003/2859; G01J 2005/0048;
(Continued)

(56) References Cited

U.S. PATENT DOCUMENTS

| 2007/0145258 A1* | 6/2007 | Nelson ................. A61B 5/0059 250/252.1 |
| 2008/0158362 A1* | 7/2008 | Butterworth ......... H04N 17/002 348/187 |

(Continued)

FOREIGN PATENT DOCUMENTS

| EP | 3343642 A1 | 7/2018 |
| JP | H05-312653 A | 11/1993 |

(Continued)

OTHER PUBLICATIONS

Xudong Jiang et al., "Investigation of a multistack voltage-tunable four-color quantum-well infrared photodetector or mid-and long-wavelength infrared detection", IEEE journal of quantum electronics, 1999, 35(11): 1685-1692.

(Continued)

*Primary Examiner* — Marcus H Taningco
(74) *Attorney, Agent, or Firm* — ScienBiziP, P.C.

(57) ABSTRACT

There is provided a detector, and a method of calibrating or correcting a detection value in a wavelength range within an evaluable range by using a detection value in a wavelength range other than the evaluable range by using the detector. The detector includes an active layer containing a quantum well or quantum dots, and that is capable of sweeping a detection peak wavelength of a detection spectrum in a wavelength range within an evaluable range and a wavelength range other than the evaluable range, and is configured to correct or calibrate a detection value in the wavelength range within the evaluable range using a detection value in the wavelength range other than the evaluable range.

14 Claims, 12 Drawing Sheets

(51) Int. Cl.
*G01J 3/42* (2006.01)
*G01J 5/20* (2006.01)
*H01L 31/0352* (2006.01)
*G01J 5/00* (2006.01)
*H01L 31/02* (2006.01)
*G01J 3/10* (2006.01)
*G01J 3/28* (2006.01)
*G01J 3/00* (2006.01)

(52) U.S. Cl.
CPC ............... *G01J 3/42* (2013.01); *G01J 5/0014* (2013.01); *G01J 5/20* (2013.01); *H01L 31/02019* (2013.01); *H01L 31/035218* (2013.01); *G01J 2003/006* (2013.01); *G01J 2003/104* (2013.01); *G01J 2003/2859* (2013.01); *G01J 2005/0048* (2013.01); *G01J 2005/0051* (2013.01); *G01J 2005/0077* (2013.01); *G01J 2005/0081* (2013.01); *G01J 2005/202* (2013.01)

(58) Field of Classification Search
CPC ....... G01J 2005/0051; G01J 2005/0077; G01J 2005/0081; G01J 2005/202; G01J 3/0297; G01J 3/108; G01J 3/42; G01J 5/0014; G01J 5/20; G01N 21/3504; H01L 31/02019; H01L 31/035218
See application file for complete search history.

(56) References Cited

U.S. PATENT DOCUMENTS

| | | | |
|---|---|---|---|
| 2009/0051910 A1* | 2/2009 | Imura | G01J 3/0254 356/243.8 |
| 2014/0003579 A1* | 1/2014 | Berruyer | G01T 1/362 378/82 |
| 2014/0054452 A1* | 2/2014 | Ruyter | G01J 5/047 250/252.1 |
| 2015/0253256 A1* | 9/2015 | Zhou | G01N 21/95607 356/237.5 |
| 2016/0349228 A1* | 12/2016 | Kester | G01J 5/0896 |
| 2018/0058921 A1* | 3/2018 | Zimmerman | G01J 1/0414 |
| 2018/0172508 A1* | 6/2018 | Kotani | G01J 5/20 |
| 2018/0299326 A1* | 10/2018 | Kitazawa | G01J 5/0014 |

FOREIGN PATENT DOCUMENTS

| | | |
|---|---|---|
| JP | 2009-281863 A | 12/2009 |
| JP | 2014-060321 A | 4/2014 |
| JP | 2018-100959 A | 6/2018 |

OTHER PUBLICATIONS

S. V. Bandara et al., "Tuning and tailoring of broadband quantum-well infrared photodetector responsivity spectrum", Applied Physics Letters, 2005, 86(15): 151104.

* cited by examiner

DETECTOR, CORRECTION METHOD AND CALIBRATION METHOD OF DETECTOR, DETECTION APPARATUS AND DETECTION SYSTEM

BACKGROUND

1. Field

The present disclosure relates to a detector, a correction method and a calibration method of a detector using the same, and a detection apparatus.

2. Description of the Related Art

A bolometer has been used as one type of infrared detector, however, the bolometer is not capable of responding quickly due to detect an amount of heat and does not enable selecting of a wavelength for measurement. Therefore, the infrared detector that measures a temperature of an object in a non-contact manner, by detecting an electromagnetic wave generated by a black body (ash body) radiation using a quantum well and quantum dots, has been suggested and developed as a new device. The new device is capable of responding quickly and also enables selecting and sweeping of a detection wavelength so that a spectrum in an infrared range can be detected.

For any type of infrared detector, a detection value includes an error due to aging variation, environmental temperature, or the like. In order to reduce such an error, correction or calibration of the detection value is generally performed. In the related art, a mechanical shutter, a plane mirror, or the like have been used for correcting or calibrating the detection value.

For example, Japanese Unexamined Patent Application Publication No. 05-312653 discloses that in an infrared imaging apparatus, a correction coefficient storage system calculates and stores a correction coefficient for removing an influence of a thermal radiation in the atmosphere from an output of a detection element when air is collimated by opening a shutter ahead of an optical system and an output of a detection element when a standard black body is collimated by closing the shutter.

Furthermore, for example, Japanese Unexamined Patent Application Publication No. 2009-281863 discloses that, in an infrared imaging system, by a standstill or rotation of a plane mirror, a traveling speed of an image on an image sensor can be made fully shorter than a thermal time constant of a detector and an image flow is generated, thus equivalently creating a state where an infrared ray having uniform intensity enters from an offset correction data acquisition range through an atmospheric window, and acquiring offset correction data without using any shutters or defocusing methods.

However, when the mechanical shutter, the plane mirror, or the like are used as described in Japanese Unexamined Patent Application Publication No. 05-312653 and Japanese Unexamined Patent Application Publication No. 2009-281863, an apparatus becomes large and aging deterioration is also fast. Also, in both of Japanese Unexamined Patent Application Publication No. 05-312653 and Japanese Unexamined Patent Application Publication No. 2009-281863, there is no concept of using a wavelength range other than the atmospheric window or a wavelength sweep (scan), nor removing an influence of environmental temperature in the same manner.

SUMMARY

It is desirable to provide a detector, a correction method of the detector, and a calibration method of the detector which are configured to correct or calibrate a detection value without using a mechanical method.

According to an aspect of the disclosure, there is provided a detector that includes an active layer containing a quantum well or quantum dots, and that is capable of sweeping a detection peak wavelength of a detection spectrum in a wavelength range within an evaluable range and a wavelength range other than the evaluable range, and is configured to correct or calibrate a detection value in the wavelength range within the evaluable range using a detection value in the wavelength range other than the evaluable range.

According to another aspect of the disclosure, there is provided a correction method of a detector that includes correcting a detection value in a wavelength range within an evaluable range based on a detection value in a wavelength range other than the evaluable range, using the detector according to the above aspect.

According to still another aspect of the disclosure, there is provided a calibration method of a detector that includes calibrating a detection value in a wavelength range within an evaluable range based on a detection value in a wavelength range other than the evaluable range, using the detector according to the above aspect.

According to still another aspect of the disclosure, there is provided a detection apparatus that includes a plurality of the detectors according to the above aspect.

DESCRIPTION OF THE EMBODIMENTS

In the present disclosure, an evaluable range means a wavelength range in which evaluation can be made by detecting light from a measurement target object.

Embodiment 1

Figure 1A:
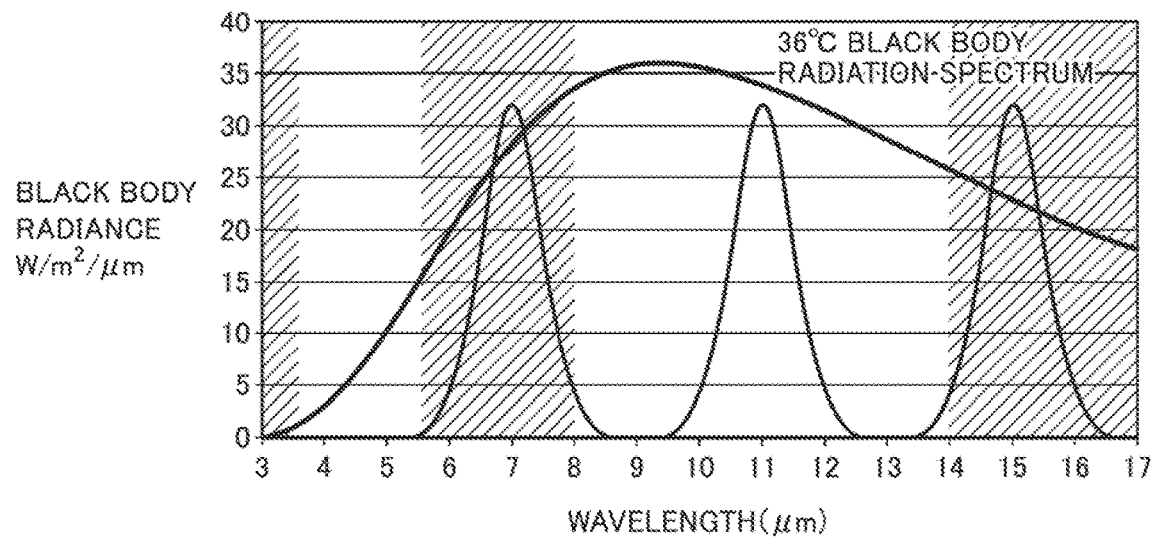
FIG. 1A is a graph showing an example of detection spectrum detected by a detector.
Figure 1B:
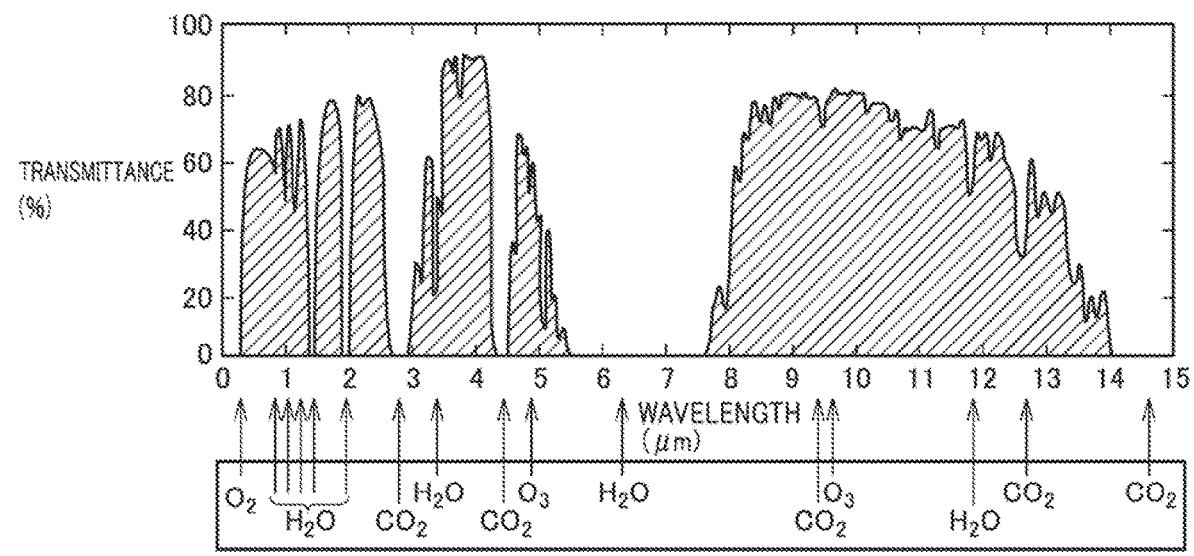
FIG. 1B is a graph showing an example of atmospheric transmittance.

In the present embodiment, a configuration that uses an atmospheric window as an evaluable range will be described. Therefore, a detector is an infrared detector. FIG. 1A is a graph showing a black body radiance from an object at a temperature of 36° C. as an example of detection spectrum detected by the infrared detector, wherein a vertical axis represents a black body radiance (W/m$^2$/μm) and a horizontal axis represents a wavelength (μm). FIG. 1B is a graph showing an example of atmospheric transmittance in the infrared detector, wherein a vertical axis represents a transmittance (%) and a horizontal axis represents a wavelength (μm). As shown in FIG. 1B, a far infrared ray radiated from a distance is absorbed by gas such as water vapor in atmosphere in most wavelength ranges. An electromagnetic wave only in ranges of 3.4 to 5.5 μm and 8 to 14 μm from a distance can be detect. These ranges are known as an "atmospheric window".

Also, FIG. 1A illustrates a case where the detection spectrum of the detector is Gaussian distributed, a full width at half maximum of a detection wavelength is set to 2 μm and a detection wavelength peak is set to 7 μm, 11 μm, and 15 μm. At 7 μm and 15 μm, a range of the detection spectrum hardly includes a range of the atmospheric window (a range of white background in the graph of FIG. 1A), and a far infrared radiation from a target object and other objects can hardly be detected. On the other hand, if there is a peak at 11 μm, a far infrared radiation from the target object and other objects can be detected.

The infrared detector of the present disclosure includes an active layer that contains a quantum well or quantum dots. The infrared detector including the active layer that contains a quantum well or quantum dots can sweep a detection peak wavelength by sweeping a voltage (applied voltage) (Stark shift). A radiation spectrum of a target object can be measured using this phenomenon. By comparing the radiation spectrum with Planck's equation, a temperature of the target object can be found.

In the infrared detector, a detection value includes an error due to aging variation, environmental temperature, or the like. In order to reduce such an error, correction or calibration of the detection value is generally performed. The infrared detector of the present disclosure, as described above, includes an active layer containing a quantum well or quantum dots, is capable of sweeping a detection peak wavelength of an infrared detection spectrum in a wavelength range within an atmospheric window and a wavelength range other than the atmospheric window, and is configured to correct or calibrate a detection value in the wavelength range within the atmospheric window using a detection value in the wavelength range other than the atmospheric window.

In the infrared detector of the present disclosure, a correction coefficient is determined or a calibration is performed when a detection wavelength is in the wavelength range other than the atmospheric window. The infrared detector of the present disclosure is configured so that a sweep of a detection peak wavelength is performed by sweeping an applied voltage, and, when the applied voltage is 0V, the detection peak wavelength may be in the wavelength range other than the atmospheric window. In this case, it is possible to determine a correction coefficient or perform a calibration in order to cope with a deterioration of a detection sensitivity and a change in an offset/gain value of a calculation circuit in a state where the infrared detector is in operation.

In order to detect a radiation spectrum from a target object, an applied voltage may be changed and a detection wavelength may be moved to a range of an atmospheric window. The infrared detector of the present disclosure is configured so that a sweep of a detection peak wavelength is performed by sweeping an applied voltage, and, when the applied voltage is 0V, the detection peak wavelength may be on a shorter wavelength side than an atmospheric window. In this case, a detection wavelength can be swept to a range of the atmospheric window by increasing the applied voltage.

On the other hand, in the infrared detector of the present disclosure is configured so that a sweep of a detection peak wavelength is performed by sweeping an applied voltage, and, when the applied voltage is 0V, the detection peak wavelength may be on a longer wavelength side than an atmospheric window. In this case, a detection wavelength can be swept to a range of the atmospheric window by decreasing (making minus) the applied voltage.

Furthermore, when an applied voltage is not 0V, a detection wavelength may be in a range other than an atmospheric window. In this case, at the timing when it is determined that correction or calibration is necessary, the applied voltage may be changed and the detection wavelength may be moved to a range within the atmospheric window.

Hereinafter, correction or calibration of a detection value in the present disclosure will be described in more detail by taking as an example a case where a deterioration of a detection sensitivity and a change in an offset/gain value of a calculation circuit occur due to aging variation of a detector (these are cases where it is not necessary to consider a wavelength dependence).

Figure 2:
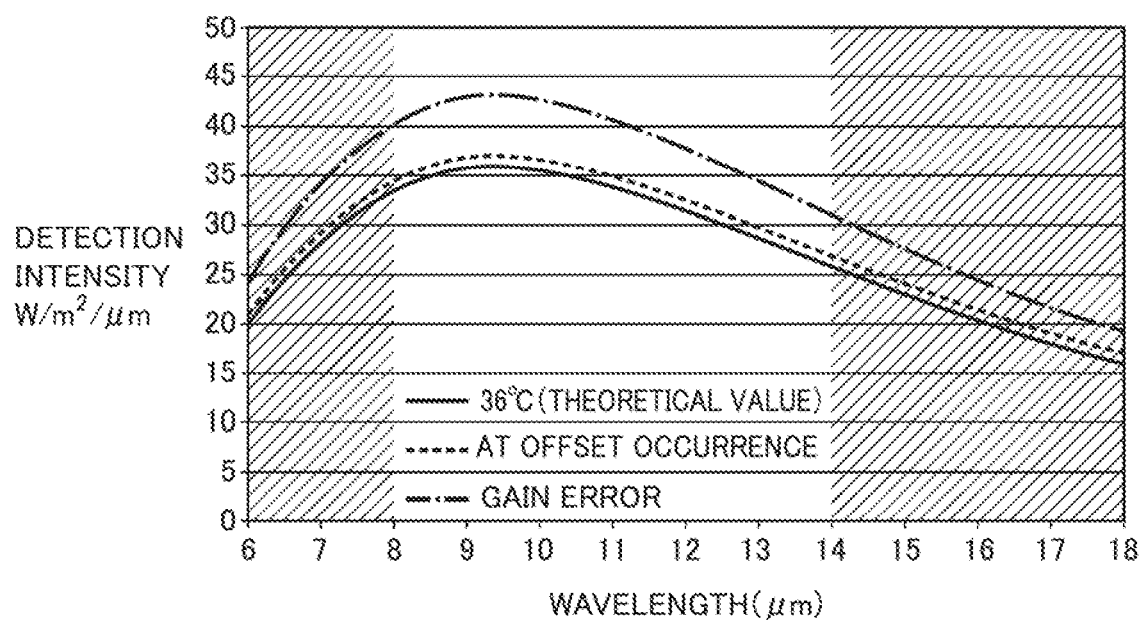
FIG. 2 is a graph showing an example of detection result by the detector of the present disclosure.

FIG. 2 is a graph showing an example of detection result by the infrared detector of the present disclosure wherein a vertical axis represents a detection intensity (W/m$^2$/μm) and a horizontal axis represents a wavelength (μm). A solid line shows a radiation spectrum from a target object when it can be measured correctly (36° C., theoretical value), a broken line when an intensity offset occurs, and a one-dot chain line when a gain change of a calculation circuit occurs. When correcting a detection value, the infrared detector compares a result, which is measured when a detection wavelength is in a range other than an atmospheric window, with a detection value at the time of shipment, and calculates a correction coefficient so that a difference and a ratio from the comparison are corrected. When measuring a radiation spectrum from a target object by changing an applied voltage, it is possible to calculate an accurate temperature of the target object by using the correction coefficient with the result. In addition, when calibrating a detection value, a circuit constant may be adjusted corresponding to these correction coefficients.

First, consider a case where an intensity offset occurs. A far infrared ray radiated from a target object far from the infrared detector is not detected when a detection peak wavelength is in a range other than the atmospheric window. Therefore, by comparing a detection value when a detection peak wavelength is in the range other than the atmospheric window with a detection value at the time of shipment, it is possible to determine a correction constant for removing an offset, or to perform calibration that adjusts the offset so as to have the same detection value at the time of shipment, without using a shutter or the like, unlike the related art.

Next, consider a case where a sensitivity change occurs due to a gain change of a calculation circuit or a deterioration of the infrared detector. Also, in this case, a detection value when a detection peak wavelength is in the range other than the atmospheric window does not include a far infrared ray radiated from the target object far from the infrared detector. Subsequently, by comparing a detection value when a detection peak wavelength is in the range other than the atmospheric window with a detection value at the time of shipment, it is possible to determine a correction constant so as to have the same detection value at the time of shipment, or to perform calibration using a gain adjustment, without using a shutter or the like, unlike the related art.

Expressions are represented as follows.

Detection value=Gain×Detection value at shipment+ Offset or,

Detection value=Gain×(Detection value at shipment+ Offset)

From the above expressions, even if both of the offset and the gain errors are generated, it is possible to determine or calibrate correction constants for both of the offset and the gain by detecting a certain range rather than one wavelength in the range other than the atmospheric window and by fitting so that a difference between the detection value when the detection peak wavelength is in the range other than the atmospheric window and the detection value at the time of shipment becomes the smallest.

Figure 3:
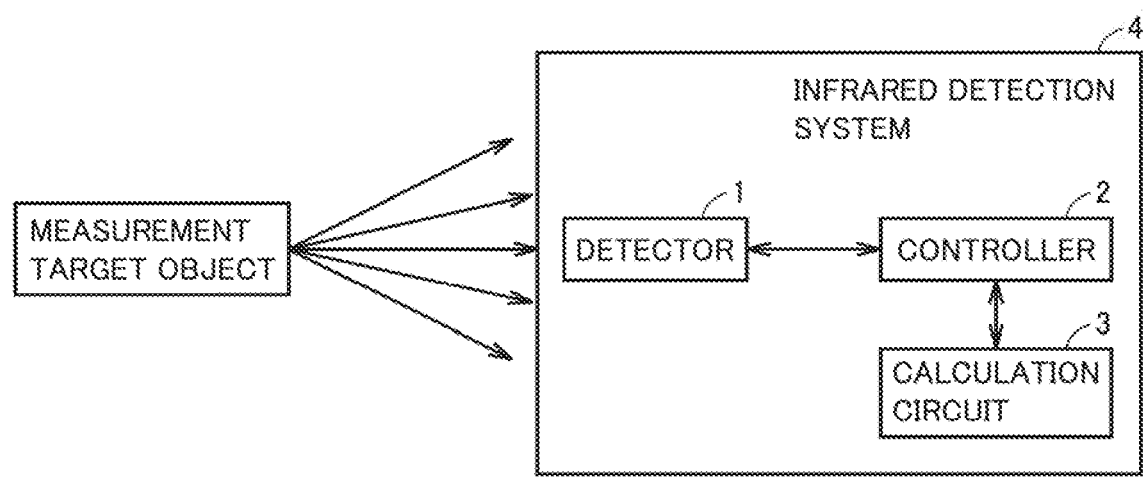
FIG. 3 is a diagram schematically showing a configuration example of a desirable example of detector of the present disclosure.

FIG. 3 is a diagram schematically showing a configuration example of a desirable example of infrared detector 1 of the present disclosure and an infrared detection system 4 including the infrared detector 1, a controller 2, and a calculation circuit 3. The infrared detector 1 of the present disclosure is electrically connected to the controller 2 and the calculation circuit 3 as in the example shown in FIG. 3. The infrared detector 1 includes an active layer containing a quantum well or quantum dots, and the infrared detector can detect a wavelength range of 3.4 to 5.5 μm or 8 to 14 μm which is called an atmospheric window. The controller 2 is a section for controlling an applied voltage value to be applied to the infrared detector 1 and the calculation circuit 3 is a section for calculating a temperature of a measurement target object from a wavelength dependence of a detection intensity (a detection spectrum). To obtain an accurate temperature of a target object the calculation circuit 3 can also calculates other calculation instead of the infrared detector 1, for example environmental temperature, a radiance from a surrounding object, a radiation spectrum, a ratio of a measurement value to a theoretical detection value, a correction coefficient and so on. The infrared detector 1 can sweep a detection peak wavelength by sweeping a voltage (applied voltage), and the applied voltage to be applied to the infrared detector is determined based on a detection value of the infrared detector. The infrared detector may be a single element, or may be an array or an imager which are made up of a plurality of elements.

Figure 4:
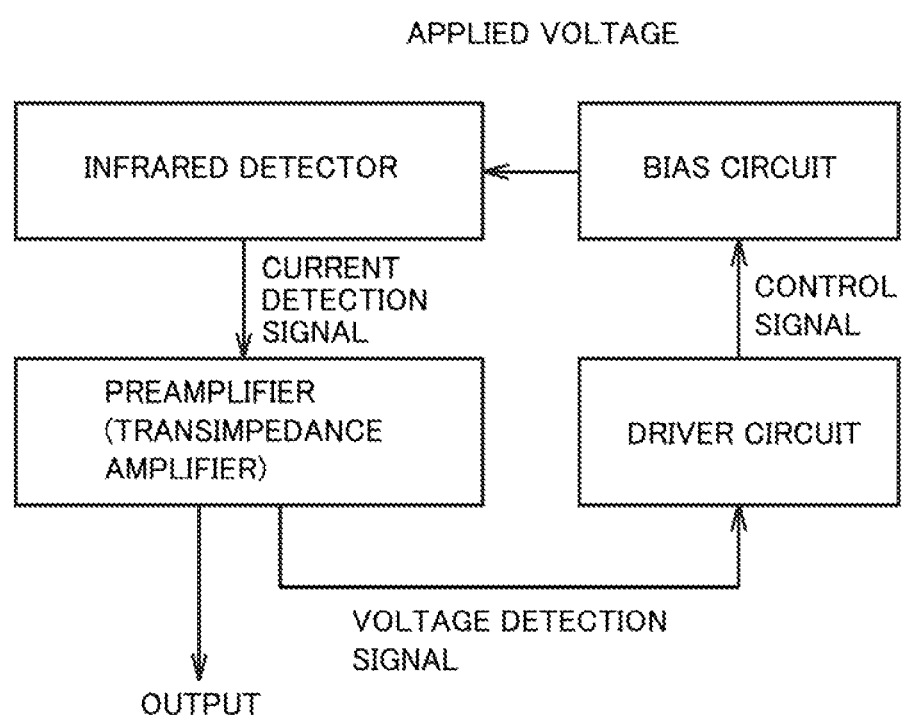
FIG. 4 is an example of block diagram of the detector of the present disclosure.

FIG. 4 is an example of block diagram of the infrared detection system of the present disclosure. The infrared detector is electrically connected to a preamplifier (transimpedance amplifier) so that a current detection signal can flow therethrough, and the preamplifier is configured to be capable of outputting and is electrically connected to a driver circuit so that a voltage detection signal can flow therethrough. In the example shown in FIG. 4, the driver circuit is electrically connected to a bias circuit so that a control signal can flow therethrough, and the bias circuit is electrically connected to the infrared detector so that a bias voltage (applied voltage) can be applied thereto. The preamplifier, the driver circuit, and the bias circuit correspond to the controller 2.

Although only one infrared detector is shown in FIG. 4, in a case of an infrared detector array in which a plurality of infrared detectors are integrated, it is possible to commonly use a driver circuit and a preamplifier. A gain or an offset may be set for each infrared detector, or a certain value may be set in an external circuit and a deviation from the value may be adjusted in a circuit attached to each infrared detector. The present disclosure also provides a detection apparatus including a plurality of infrared detectors of the present disclosure. According to the detection apparatus of the present disclosure as described above, it is possible to easily and efficiently perform calibration or correction with manufacturing variance of the detection apparatus and it is possible to reduce an error in a measurement result provided to a user.

Figure 5:
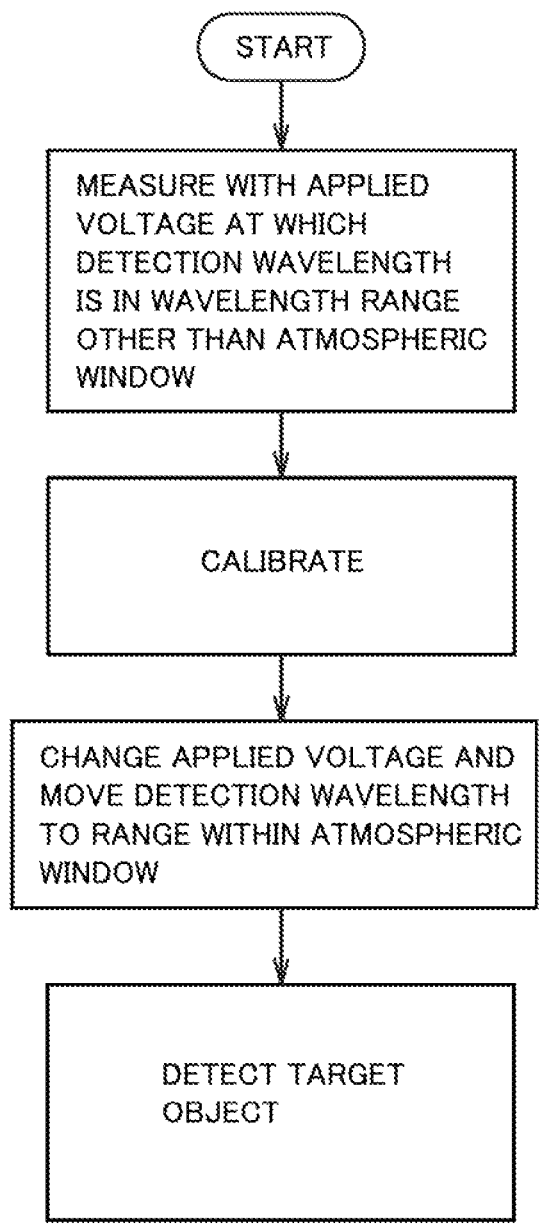
FIG. 5 is a flowchart showing an example of control of a detector of the present disclosure in Embodiment 1.

FIG. 5 is a flowchart showing an example of control of the infrared detector of the present disclosure in Embodiment 1. For example, the following steps (1) to (4) are performed for each element.

(1) Measure with an applied voltage at which a detection wavelength is in a wavelength range other than the atmospheric window, (2) calibrate, (3) change the applied voltage and move the detection wavelength to the range within the atmospheric window, (4) detect a target object.

Figure 6:
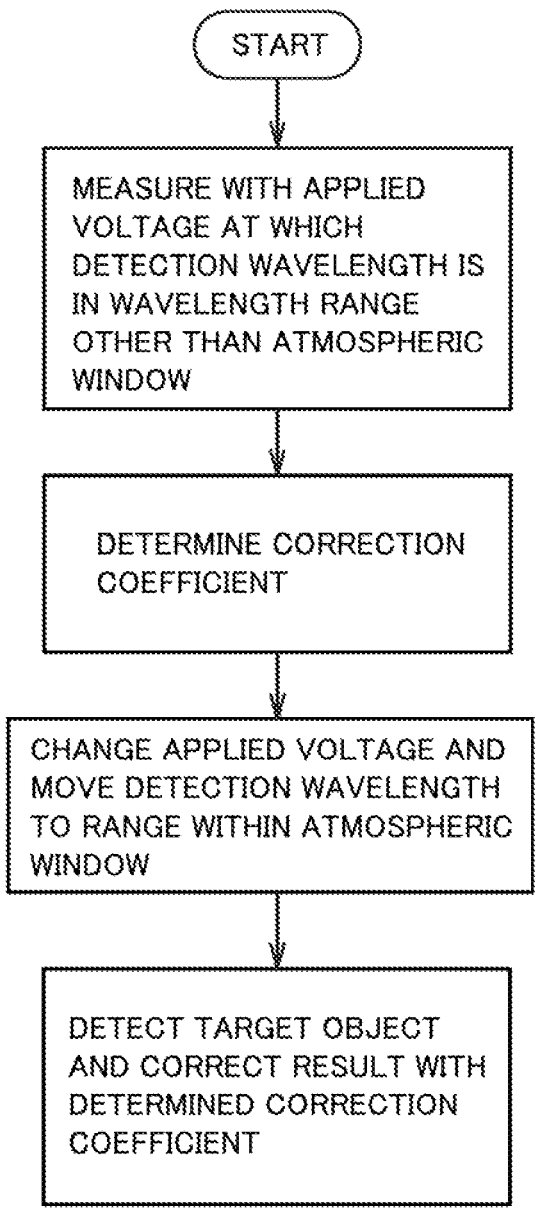
FIG. 6 is a flowchart showing another example of control of the detector of the present disclosure in Embodiment 1.

FIG. 6 is a flowchart showing another example of control of the infrared detector of the present disclosure in Embodiment 1. For example, the following steps (1) to (4) are performed for each element.

(1) Measure with an applied voltage at which a detection wavelength is in a wavelength range other than the atmospheric window, (2) determine a correction coefficient, (3) change the applied voltage and move the detection wavelength to the range within the atmospheric window, (4) detect a target object and correct a result with the determined correction coefficient.

The above steps (1) to (3) may be performed each time the detection is performed, or only once at the beginning.

As described above, the infrared detection system of the present disclosure may store a detection result when a detection wavelength before product shipment is in a wavelength range other than the atmospheric window. For example, the infrared detector may detect at a detection wavelength before product shipment that is in a wavelength range other than the atmospheric window, store the detection result, and at the time of use, a calibration or a correction coefficient determination may be performed by comparing with the stored detection result. The result after the calibration or the correction is an evaluation result.

A preferable specific example of the infrared detector of the present disclosure is an infrared detector using an intersubband transition such as a quantum dot infrared photodetector (QDIP) containing quantum dots in an active layer, a quantum well infrared photodetector (QWIP) containing a quantum well in an active layer, or the like. In particular, a preferable example of a configuration of the infrared detector is described in Applied Physics Letters 88, 121102 (2006), Applied Physics Letters 84, 3277 (2004), or the like.

Embodiment 2

Figure 7:
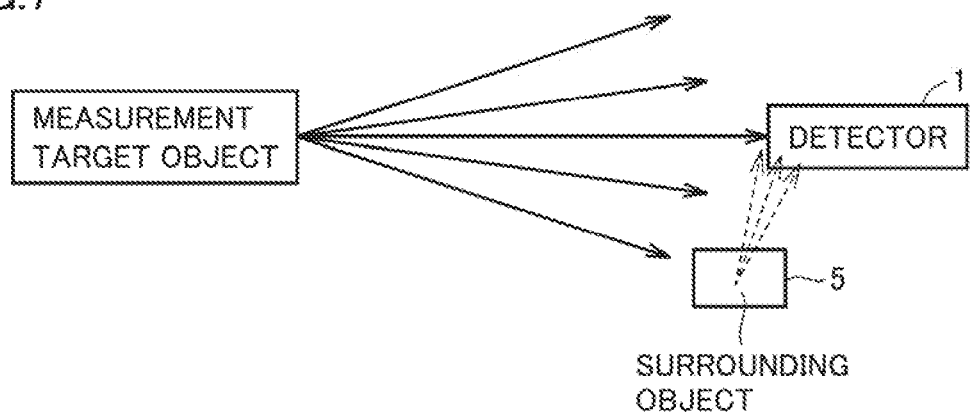
FIG. 7 is a diagram schematically showing a configuration example of another desirable example of detector of the present disclosure.

In the present embodiment, a configuration that uses an atmospheric window as an evaluable range will be described. Therefore, a detector is an infrared detector. FIG. 7 is a diagram schematically showing a configuration example of another desirable example of infrared detection system 4 of the present disclosure. In FIG. 7, the controller and calculation circuit shown in FIG. 3 are not shown. In the present embodiment, consideration is given to an occurrence of an error due to a difference in environmental temperature (aging variation is not taken into account).

Every object radiates heat according to the temperature of the object. In particular, since an object near room temperature has a peak of a radiation spectrum in a far infrared range, if an electromagnetic wave radiated from an object other than a measurement target object (the surrounding object 5 in FIG. 7) is detected, then an error occurs in a temperature to be calculated.

If a detection wavelength is in the wavelength range other than the atmospheric window, an infrared ray radiated from a distant object is absorbed by an atmosphere and is not detected, however, an infrared ray radiated from an object near the infrared detector or the infrared detector itself is detected.

An electromagnetic wave (background) radiated from a surrounding object is detected in the wavelength range other than the atmospheric window, and both of the electromagnetic wave (background) radiated from the surrounding object and the electromagnetic wave radiated from the measurement target object are detected in the wavelength range within the atmospheric window.

Figure 8:
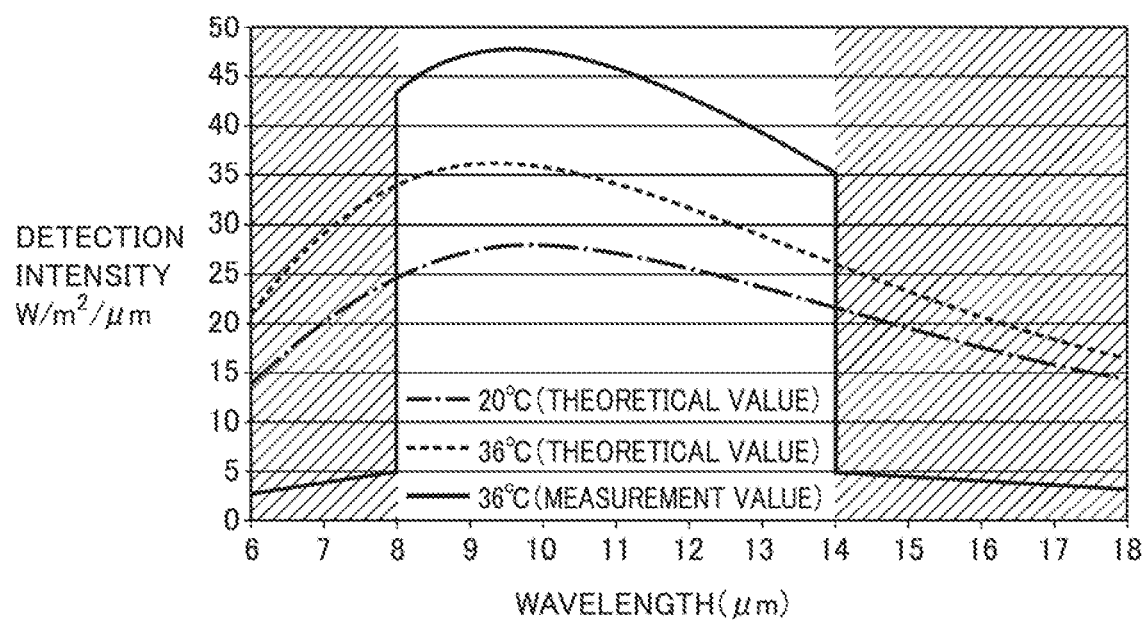
FIG. 8 shows a detection spectrum of the detector when a temperature of a measurement target object is 36° C. and a temperature of a surrounding object is 20° C.

FIG. 8 shows a detection spectrum of the infrared detector when a temperature of a measurement target object is 36° C. and a temperature of a surrounding object is 20° C., wherein a vertical axis represents a detection intensity (W/m²/μm) and a horizontal axis represents a wavelength (μm). Here, the graph in FIG. 8 shows a solid line indicates a measurement value at 36° C., a broken line indicates a theoretical value at 36° C., and a one-dot chain line indicates a theoretical value at 20° C. From the spectrum in the range other than the atmospheric window, among the spectra as shown in FIG. 8, a background spectrum in the range of the atmospheric window can be estimated as follows.

First, a temperature (environmental temperature) of the surrounding object is calculated from a detection value in the range other than the atmospheric window. Since a general object is not a black body, an amount of radiation when the object is at the same temperature as the black body is smaller than an amount of radiation of the black body. If a ratio of the amount of radiation of the surrounding object to the amount of radiation of the black body is an emissivity ε, the emissivity ε is always 1 or less.

If the object surrounding the infrared detector is a housing of the infrared detector, material and surface condition of the housing will not change, so the emissivity ε can be measured in advance. Also, since the positional relationship between the housing and the infrared detector does not change, the ratio α detected by the infrared detector among the electromagnetic waves radiated by the housing can also be measured and calculated in advance. Therefore, the temperature T can be calculated from a detection value B (λ) at a certain wavelength λ in the range other than the atmospheric window by using the following Planck's equation. This is called a one-color thermometry.

$$B(\lambda) = \frac{2hc^2}{\lambda^5} \frac{1}{\exp\left[\frac{hc}{\lambda k_B T}\right] - 1}$$

Figure 9:
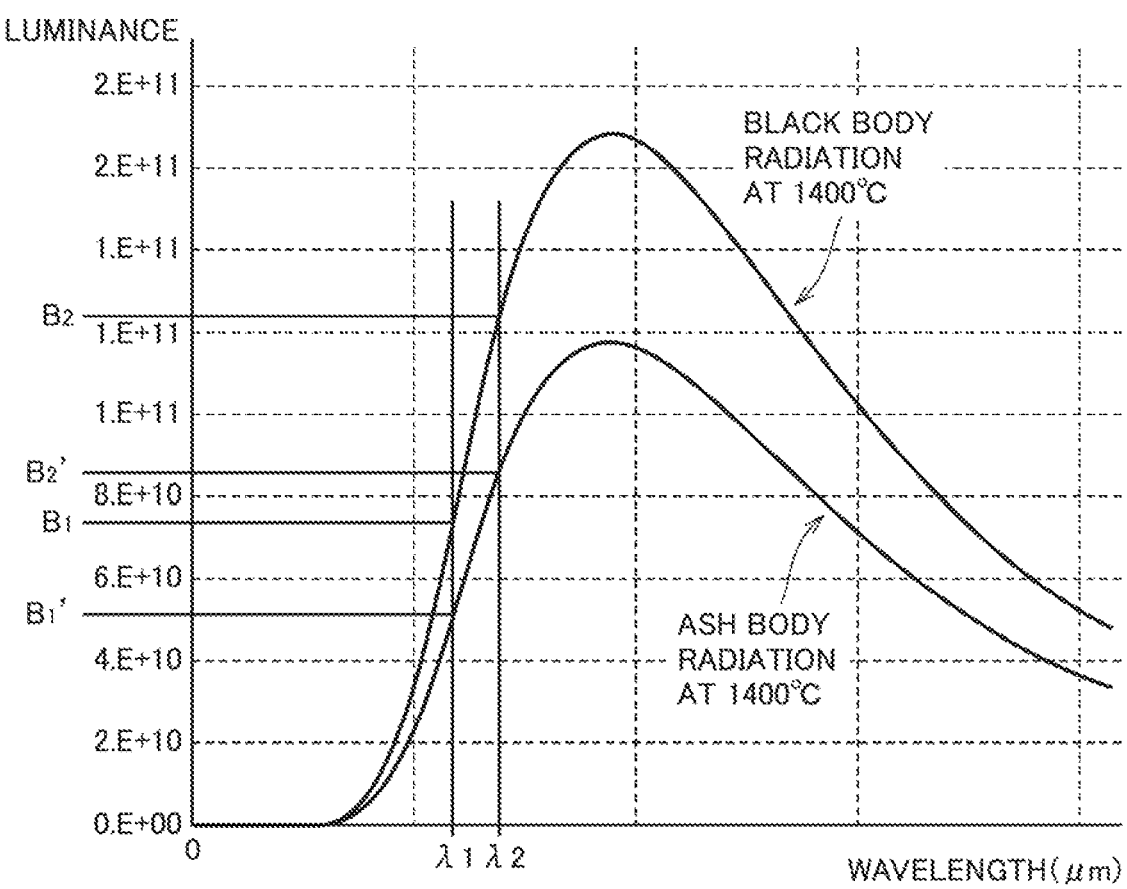
FIG. 9 is a graph for explaining a two-color thermometry.

In addition, in case of the objects surrounding the infrared detector are different, a temperature can be calculated by a two-color thermometry. Here, FIG. 9 is a graph for explaining the two-color thermometry, wherein a vertical axis represents a radiance and a horizontal axis represents a wavelength (μm). If a ratio of radiance detected by the infrared detector among the one radiated by the housing is α, the detection value B" can be obtained as follows.

$$\frac{B'_1}{B'_2} = \frac{\varepsilon B_1}{\varepsilon B_2} = \frac{B_1}{B_2}$$

$$\frac{B''_1}{B''_2} = \frac{\alpha \varepsilon B_1}{\alpha \varepsilon B_2} = \frac{B_1}{B_2}$$

In the two-color thermometry, if a wavelength range, in which an emissivity of two wavelengths of a substance to be measured is the same, is selected, the emissivity ε is automatically canceled, so it is not affected by the emissivity. Among the electromagnetic waves radiated by the housing, the ratio α detected by the infrared detector is similarly canceled. Therefore, a temperature can be calculated by comparing the ratio of the detection values of the two wavelengths among the spectra of the range other than the atmospheric window with the ratio obtained from Planck's equation. Once the environmental temperature has been calculated, a background value in the wavelength range of the atmospheric window can be found.

In a case of the one-color thermometry, since the emissivity ε of the housing and the ratio α detected by the infrared detector among the electromagnetic waves radiated by the housing are known, it is possible to calculate the radiance (background value) from the housing in the wavelength range of the atmospheric window by inputting the calculated temperature to Planck's equation and multiplying the emissivity ε of the housing and the ratio α detected by the infrared detector among the electromagnetic waves radiated by the housing.

In a case of the two-color thermometry, the temperature of the housing can be found by inputting the calculated temperature to Planck's equation and taking the ratio with the detection value of the wavelength measured in the range other than the atmospheric window. Then, from the black body radiation spectrum at the temperature, an integrated value (theoretical detection value) of the radiance in the wavelength range being detected can be found. Thus, the emissivity ε of the housing, the ratio α detected by the infrared detector among the electromagnetic waves radiated by the housing, and a product such as transmittance of an intervening optical system can be found, that is, a ratio of a measurement value to a theoretical detection value can be found. From this, it is possible to calculate a radiance (background value) from the housing in the wavelength range of the atmospheric window.

As described above, the infrared detection system of the present disclosure is configured to calculate a temperature of a housing by the method such as the one-color thermometry or the two-color thermometry, and from the temperature, calculate an emissivity, a solid angle, and a coefficient which is a product such as transmittance of an intervening optical system. From this, it is possible to calculate a radiance (background value) from a housing in the wavelength range of the atmospheric window.

By subtracting the spectrum from the detection spectrum, only a radiation spectrum from a target object can be extracted, and a temperature of the target object can be accurately calculated. That is, a correction constant (background value) can be determined or calibrated. As described above, the infrared detection system of the present disclosure may be configured such that a radiation spectrum from a surrounding object is calculated from a spectrum in the wavelength range other than the atmospheric window and only the radiation spectrum from a target object is extracted by subtracting the calculated spectrum from a detection spectrum.

Figure 10:
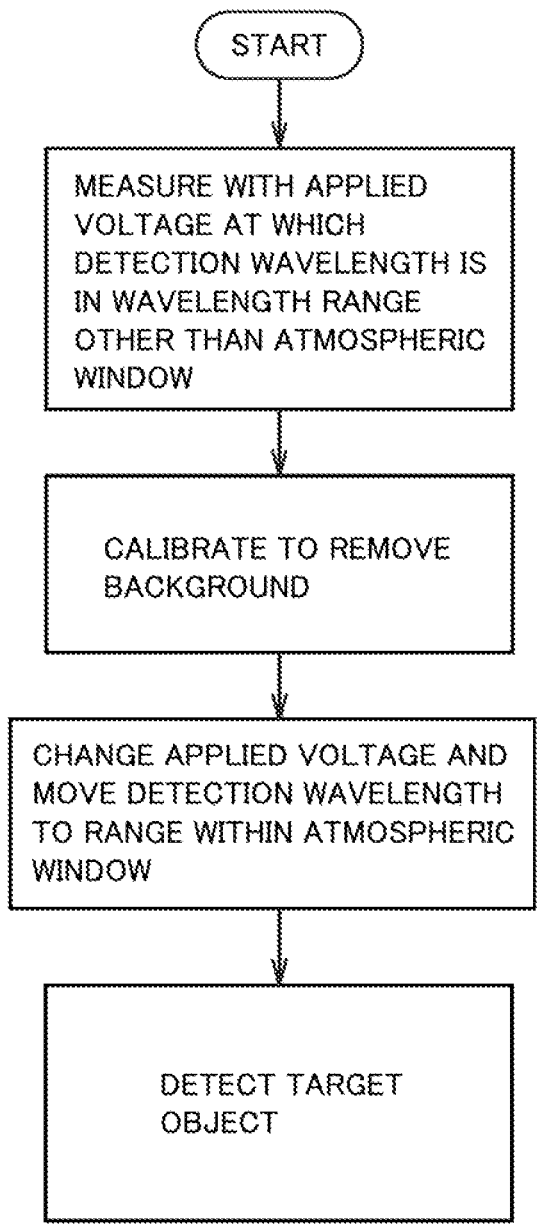
FIG. 10 is a flowchart showing an example of control of a detector of the present disclosure in Embodiment 2.

FIG. 10 is a flowchart showing an example of control of the infrared detector of the present disclosure in Embodiment 2. For example, the following steps (1) to (4) are performed for each element.

(1) Measure with an applied voltage at which a detection wavelength is in a wavelength range other than the atmospheric window, (2) calibrate and remove a background, (3) change the applied voltage and move the detection wavelength to the range within the atmospheric window, (4) detect a target object.

Figure 11:
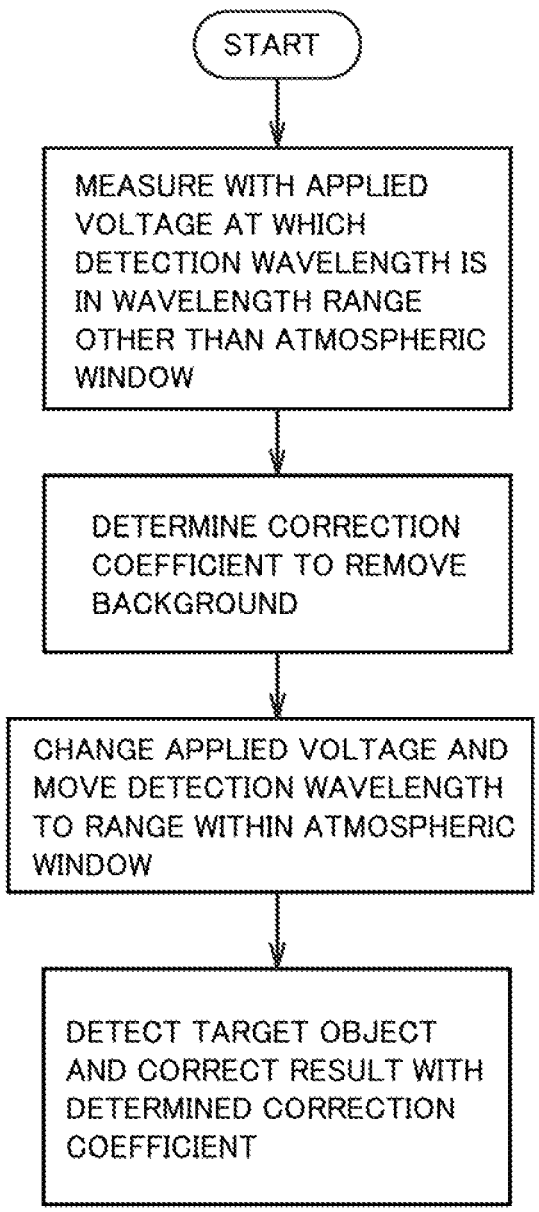
FIG. 11 is a flowchart showing another example of control of the detector of the present disclosure in Embodiment 2.

FIG. 11 is a flowchart showing another example of control of the infrared detector of the present disclosure in Embodiment 2. For example, the following steps (1) to (4) are performed for each element.

(1) Measure with an applied voltage at which a detection wavelength is in a wavelength range other than the atmospheric window, (2) determine a correction coefficient to remove a background, (3) change the applied voltage and move the detection wavelength to the range within the atmospheric window, (4) detect a target object and correct a result with the determined correction coefficient.

The above steps (1) to (3) may be performed each time the detection is performed, or only once at the beginning.

As described above, the infrared detection system of the present disclosure may store a detection result when a detection wavelength before product shipment is in a wavelength range other than the atmospheric window. For example, the infrared detector may detect a detection wavelength before product shipment that is in a wavelength range other than the atmospheric window, store the detection result, and at the time of use, a calibration or a correction coefficient determination may be performed by comparing with the stored detection result. The result after the calibration or correction is an evaluation result.

Embodiment 3

In the present embodiment, a configuration that uses an atmospheric window as an evaluable range will be described. Therefore, a detector is an infrared detector. The relationship between an applied voltage and a detection wavelength (peak value) may also change due to aging variation, changes in the circuit constant depending on a temperature, or the like. Therefore, in the present embodiment, correction or calibration is performed using a boundary between a range of the atmospheric window and the other range. As described above, the infrared detection system of the present disclosure may be configured to compare the applied voltage value at the boundary between the range of the atmospheric window and the other range with a value at the time of shipment, and, when there is a deviation, correct or calibrate the detection value.

Referring to FIG. 1B again, for example, in a case where a detection wavelength range is 7 to 15 μm, when the wavelength is swept from 7 μm to a long wavelength, as shown in FIG. 1B, the detection intensity is initially 0, but it increases rapidly from around 7.5 μm and decreases rapidly around 14 μm. The rapidly increasing voltage value and the rapidly decreasing voltage value are compared with the value at the time of shipment, and, when there is a deviation, correction or calibration is performed. Alternatively, correction or calibration may be performed using an absorption peak of an atmospheric gas present at the boundary between the range of the atmospheric window and the other range.

Note that a swept wavelength range may be 3.4 to 4.5 μm or 4.5 to 6 μm. In addition, if a wavelength range to be swept is set to 3.4 to 6 μm, it is possible to perform more precise correction or calibration since there is a range in which a detection intensity rapidly decreases and increases in the wavelength range to be swept.

Alternatively, the swept wavelength range may be from 5.5 μm or less to 8 μm or more, and a range in the atmospheric window may be included in an upper limit portion and a lower limit portion. If the wavelength range is configured to change an applied voltage from a negative voltage value to a positive voltage value, it is possible to perform determination or calibration of a correction constant by setting the wavelength to be in a range other than the atmospheric window when the voltage value is 0V as in Embodiment 1 and 2, and also to determine a correction constant or calibrate a wavelength as described above by changing a voltage value. As described above, the infrared detection system of the present disclosure may be configured to change the applied voltage from the negative voltage value to the positive voltage value, and set the wavelength to be in the wavelength range other than the atmospheric window when the voltage value is 0V. According to the infrared detection system of the present disclosure, by sweeping an absorption spectrum in the wavelength range including the atmospheric window and by correcting the relationship between the applied voltage and the wavelength, it is possible to calculate an accurate temperature without causing aging variation. Results after the calibrations or the corrections are evaluation results.

Figure 12:
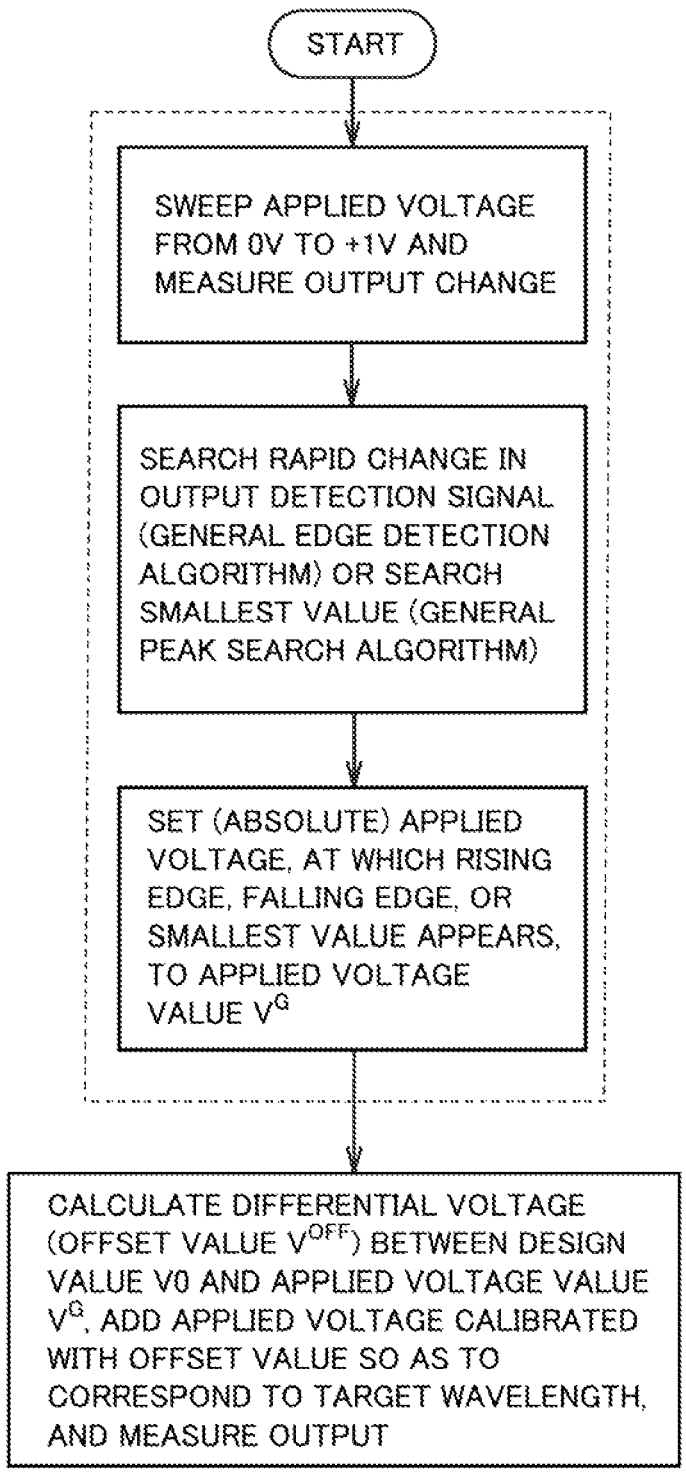
FIG. 12 is a flowchart showing an example of control of a detector of the present disclosure in Embodiment 3.

FIG. 12 is a flowchart showing an example of control of the infrared detector of the present disclosure in Embodiment 3. For example, the following steps (1) to (4) are performed for each element.

(1) sweep an applied voltage from 0V to +1V and measure an output change (here, the sweep range is set from 0V to +1V, but it is only an example and other range may be acceptable), (2) search a rapid change in an output detection signal (general edge detection algorithm) or search the smallest value (general peak search algorithm) (here, the smallest value may be a minimum value), (3) set the (absolute) applied voltage, at which a rising edge, a falling edge, or a smallest value appears, to an applied voltage value $V^G$, (4) calculate a difference (offset value $V^{OFF}$) between a design value V0 and the applied voltage value $V^G$, add an applied voltage calibrated with an offset value so as to correspond to a target wavelength, and measure an output.

The above steps (1) to (3) may be performed each time the calibration is performed, or only once at the beginning.

As described above, a calibration method of the infrared detector of the present disclosure may include a step of applying a voltage of an offset value to the infrared detector containing a quantum well or quantum dots in an active layer. For example, the infrared detector may be configured to measure a voltage of an offset value appropriate for calibration before product shipment, store the voltage of the offset value, and, at the time of use, apply the voltage of the stored offset value. Even if the configuration as in the above example is adopted, instead of measuring a detection peak wavelength for each use, a voltage of an offset value appropriate for calibration is measured before product shipment and the infrared detector may be configured to apply the voltage of the offset value at the time of use. Furthermore, the infrared detector may be configured so that an attachment for calibration can be attached. That is, the infrared detector may be configured to measure a detection peak wavelength and update a voltage value of an offset value appropriate for calibration by attaching the attachment for calibration, however, the infrared detector is normally used in a state in which the attachment for calibration is not attached.

Figure 13:
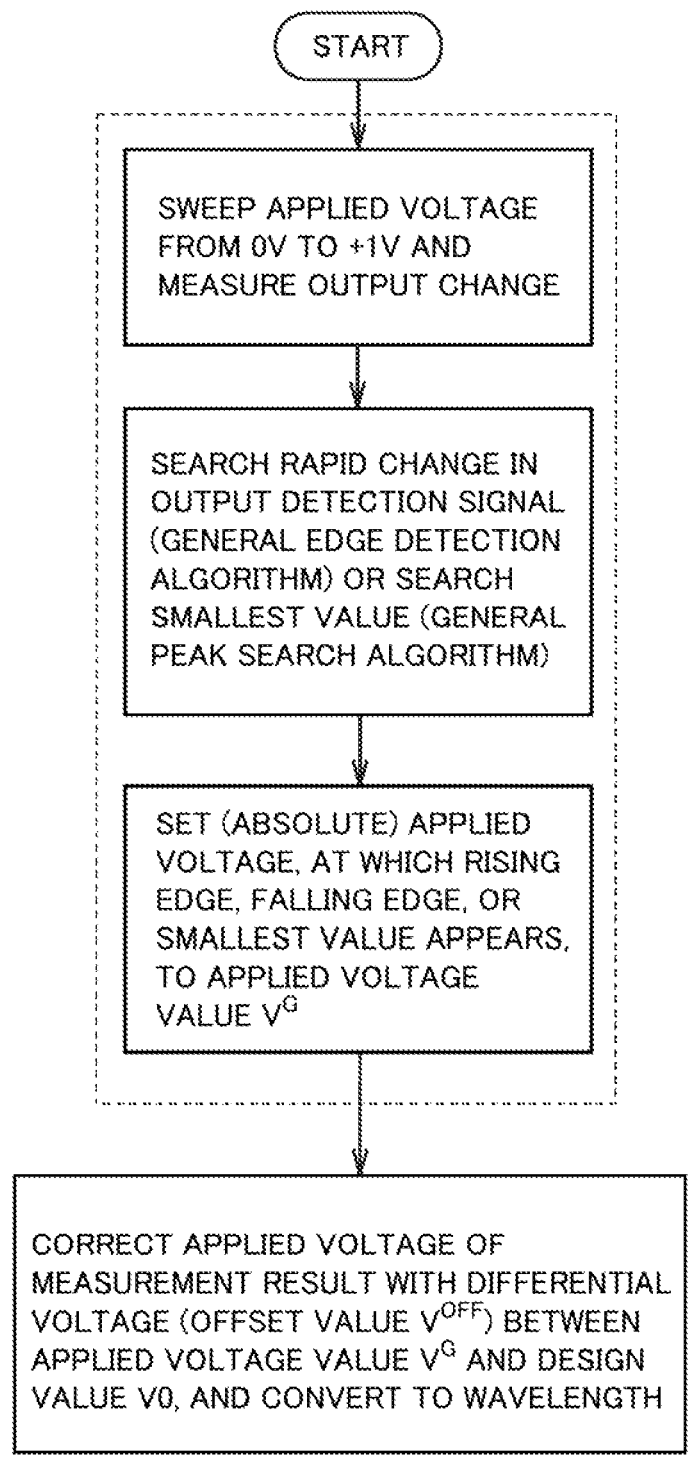
FIG. 13 is a flowchart showing another example of control of the detector of the present disclosure in Embodiment 3.

FIG. 13 is a flowchart showing another example of control of the infrared detector of the present disclosure in Embodiment 3. For example, the following steps (1) to (4) are performed for each element.

(1) sweep an applied voltage from 0V to +1V and measure an output change, (2) search a rapid change in an output detection signal (general edge detection algorithm) or search the smallest value (general peak search algorithm) (here, the smallest value may be a minimum value), (3) set the (absolute) applied voltage, at which a rising edge, a falling edge, or a smallest value appears, to the applied voltage value $V^G$, (4) correct the applied voltage of a measurement result with a differential voltage (offset value $V^{OFF}$) between the applied voltage value $V^G$ and a design value V0, and convert to a wavelength.

In the flowchart shown in FIG. 13, step (4) is different from the flowchart shown in FIG. 12, and instead of measuring by applying an applied voltage in a state where the offset value $V^{OFF}$ is given as an offset value, the applied voltage value from the measurement result of (1) is corrected with the offset value $V^{OFF}$.

In particular, when the infrared detectors are arrayed, it may be easier to correct data after measurement than to set an offset value for each element.

Figure 14:
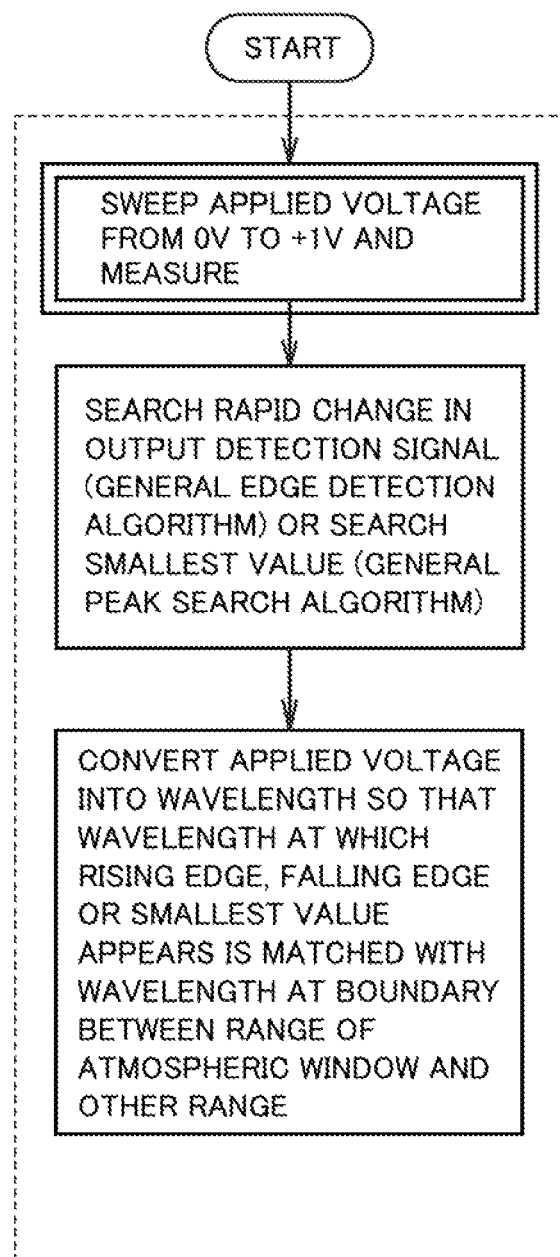
FIG. 14 is a flowchart showing still another example of control of the detector of the present disclosure in Embodiment 3.

Furthermore, the measurement result may be corrected without determining the applied voltage value $V^G$ or the offset value $V^{OFF}$ Here, FIG. 14 is a flowchart showing still another example of control of the infrared detector of the present disclosure in Embodiment 3. For example, the following steps (1) to (3) are performed for each element.

(1) sweep an applied voltage from 0V to +1V and measure, (2) search a rapid change in an output detection signal (general edge detection algorithm) or search the smallest value (general peak search algorithm) (here, the smallest value may be a minimum value), (3) convert the applied voltage into a wavelength so that the wavelength at which a rising edge, a falling edge or a smallest value appears is matched with a wavelength at a boundary between the range of the atmospheric window and the other range. In converting the applied voltage into the wavelength, an offset wavelength will be added.

That is, in the flowchart shown in FIG. 14, the applied voltage is converted into wavelengths as it is without providing a step for determining the applied voltage value $V^G$ and the offset value $V^{OFF}$. In this way, the number of steps is small, and there is no need to hold (store) the applied voltage value $V^G$, the design value V0, and the offset value $V^{OFF}$, therefore it gets simpler.

Embodiment 4

In the present embodiment, not only a boundary between a range of a single atmospheric window and a range other than the atmospheric window, but also a boundary between a range of each of a plurality of atmospheric windows and a range other than the atmospheric window will be described. Hereinafter, a case of referring to a boundary between each of two atmospheric windows λ1 and λ2 and a range other than the atmospheric window will be described.

If design values of applied voltages corresponding to λ1 and λ2 are known, an offset value $V1^{OFF}$ found by referring to λ1 and an offset value $V2^{OFF}$ found by referring to λ2 are calculated, and, in this case, for all wavelengths, an average value of the offset value $V1^{OFF}$ and the offset value $V2^{OFF}$ may be applied as an offset value $V^{OFF}$ or the relationship between a wavelength and an offset voltage may be linearly approximated from λ1 and the offset value $V1^{OFF}$, and λ2 and the offset value $V2^{OFF}$.

As described above, the detector of the present disclosure may be configured to calibrate or correct a relationship between an applied voltage and a detection wavelength (peak value) by using a boundary between a range of each of a plurality of atmospheric windows and a range other than the atmospheric window.

Furthermore, in the present embodiment, it is possible to calibrate a detection wavelength without storing a design value of an applied voltage. That is, among the minimum value, the rising edge, or the falling edge which are searched in the step (2) in the flowchart shown in FIG. 12, one having a small applied voltage value is set as a detection wavelength of a short wavelength in a wavelength range other than the atmospheric window, and one having a large applied voltage value is set as a detection wavelength of a long wavelength in a wavelength range other than the atmospheric window. Subsequently, a relation between the wavelength and the applied voltage may be linearly approximated from λ1 and $V1^G$, and λ2 and $V2^G$.

Embodiment 5

In the present embodiment, a configuration using an optical filter as an evaluable range will be described. Therefore, the detector is not limited to an infrared detector. The embodiment is different from Embodiments 1 to 4 in that an optical filter is provided between the detector 1 and a measurement target object. Thus, it is possible to correct or calibrate a detection value in a wavelength range of the evaluable range by using the detection value in the wavelength range other than the evaluable range determined by the optical filter instead of using an atmospheric window, and to perform evaluation.

As the optical filter is installed near the detector 1, a background noise in the wavelength range other than the evaluable range becomes smaller, and accordingly accuracy of correction and calibration is improved.

The optical filter may be either a long pass filter having a high transmittance at a certain wavelength or more, a short pass filter having a high transmittance at a certain wavelength or less, or a band pass filter having a high transmittance in a certain wavelength range.

A wavelength range in which transmittance of the optical filter is high, that is, at least a part of the evaluable range, may be in the wavelength range of the atmospheric window. Accordingly, it is possible to detect a radiated electromagnetic wave even if a measurement target object is located far. In addition, if at least one of wavelengths (rising edges or falling edge) at a boundary between the evaluable range and the range other than the evaluable range is within the wavelength range of the atmospheric window, a difference in an applied voltage for sweeping the wavelength in the evaluable range and the range other than the evaluable range becomes small, accordingly the time taken for the wavelength sweep is shortened, and a power consumption can be reduced. Furthermore, in correction and calibration, there is no need to consider a reduction in transmittance due to the atmospheric window, and a program for correction and calibration is simplified.

Details of correction and calibration can be performed in the same manner as in Embodiments 1 to 4.

The present disclosure contains subject matter related to that disclosed in Japanese Priority Patent Application JP 2017-226926 filed in the Japan Patent Office on Nov. 27, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A detector comprising
   an active layer containing a quantum well or quantum dots,
   wherein the detector is capable of sweeping a detection peak wavelength of a detection spectrum in a wavelength range within an evaluable range and a wavelength range other than the evaluable range, and
   wherein the detector is configured to correct or calibrate a detection value in the wavelength range within the evaluable range using a detection value in the wavelength range other than the evaluable range.

2. The detector according to claim 1,
   wherein the detector is configured to correct or calibrate the detection value in the wavelength range within the evaluable range by comparing the detection value in the wavelength range other than the evaluable range with a detection value at a time of shipment.

3. The detector according to claim 1,
   wherein the detector is configured to extract only a radiation spectrum from a target object by calculating a radiation spectrum from a surrounding object based on the detection value of the wavelength range other than the evaluable range and subtracting the calculated radiation spectrum from the detection spectrum.

4. The detector according to claim 1,
   wherein the detector is configured to calculate a temperature by using a two-color thermometry, and calculate a ratio of a measurement value to a theoretical detection value from a black body radiation spectrum at the temperature and a measurement result in a range other than the evaluable range.

5. The detector according to claim 1,
   wherein the detector is configured to correct or calibrate an applied voltage value or a wavelength in a case where the applied voltage value at a boundary between the evaluable range and a range other than the evaluable range is compared with an applied voltage value at a time of shipment and a deviation occurs between the applied voltage values.

6. The detector according to claim 1,
   wherein the detector is configured to perform a sweeping of the detection peak wavelength by applying an applied voltage, and, when the applied voltage is 0V, the detection peak wavelength is in the wavelength range other than the evaluable range.

7. The detector according to claim 1,
   wherein the detector is configured to perform a sweeping of the detection peak wavelength by applying an applied voltage, and, when the applied voltage is 0V, the detection peak wavelength is on a shorter wavelength side than the evaluable range.

8. The detector according to claim 1,
   wherein the detector is configured to perform a sweeping of the detection peak wavelength by applying an applied voltage, and, when the applied voltage is 0V, the detection peak wavelength is on a longer wavelength side than the evaluable range.

9. The detector according to claim 1,
   wherein the evaluable range is defined by an optical filter.

10. The detector according to claim 1,
    wherein the evaluable range is defined by an atmospheric window.

11. A correction method of a detector, comprising
    correcting a detection value in a wavelength range within an evaluable range based on a detection value in a wavelength range other than the evaluable range, using the detector according to claim 1.

12. A calibration method of a detector, comprising
    calibrating a detection value in a wavelength range within an evaluable range based on a detection value in a wavelength range other than the evaluable range, using the detector according to claim 1.

13. A detection apparatus comprising
    a plurality of the detectors according to claim 1.

14. A detection system comprising
    a detector according to claim 1,
    a controller configured to control an applied voltage value to be applied to the detector; and
    a calculator configured to calculate a temperature of a measurement target from a detection spectrum detected by the detector.

* * * * *